March 18, 1969 W. W. CHIROTA ET AL 3,433,916

DIRECT ELECTRICAL HARNESS SWITCHING

Filed Sept. 29, 1967

WILLIAM W. CHIROTA
ROBERT W. HOLZWARTH
THOMAS SHEWCHUCK
INVENTORS

BY John R. Faulkner
E. Dennis O'Connor
ATTORNEYS 3,433,916
DIRECT ELECTRICAL HARNESS SWITCHING

William W. Chirota, Dearborn, Robert W. Holzwarth, Allen Park, and Thomas Shewchuck, Dearborn, Mich., assignors to Ford Motor Company, Dearborn, Mich., a corporation of Delaware

Filed Sept. 29, 1967, Ser. No. 671,671
U.S. Cl. 200—166 11 Claims
Int. Cl. H01h *3/00, 9/00*

ABSTRACT OF THE DISCLOSURE

Apparatus for accomplishing electrical switching directly between electrically conductive paths formed on a pair of flexible printed circuit elements, thereby eliminating the necessity for a distinct switch assembly. The circuit elements are positioned in intimate contact and rotatable means are provided to engage one of the circuit elements and cause movement of said one circuit element relative to the other so that electrical contact may be established and broken selectively between the circuit elements conductive paths.

*Background of the invention*

Board or panels having printed, electrically conductive paths formed thereon are well known in the art. Recently, the use of flexible printed wiring elements, termed "harnesses," having flat wire conductive paths have come into wide usage. Conventionally, when it is desired to accomplish switching between the conductive paths of two distinct harnesses, or two conductive paths of a single harness, the two conductive paths are electrically connected to a switch assembly. Actually switching is then accomplished within the confines of the switch housing.

An object of this invention is to provide apparatus for accomplishing electrical switching between the conductive paths of two wiring harnesses or two conductive paths of a single harness without the use of a distinct switch assembly. The apparatus of this invention allows two harnesses or portions of a single harness to be brought into intimate contact and manipulated so that the electrically conductive material of the conductive paths is brought into and out of contact to accomplish the desired switching.

*Summary of the invention*

Apparatus constructed according to this invention for accomplishing electrical switching between a pair of flat printed circuit portions including electrically conductive paths comprises a pair of spaced apart supporting members. One of the circuit portions is positioned between the supporting members and is secured to one of the members. The other of the circuit portions is positioned for movement between the one circuit portion and the other of the members and is in intimate contact with said one circuit portion. A housing secured to the other of said members has journalled therein a rotatable means movable relative to said housing. Cooperating engaging means on the rotatable means and on the other circuit portion causes movement of the latter along the one circuit portion upon rotation of said rotatable means. This movement of the rotatable means causes the making and breaking of electrical contact between conductive paths of said circuit portions.

*Detailed description of the invention*

Figures 1, 2, 4:
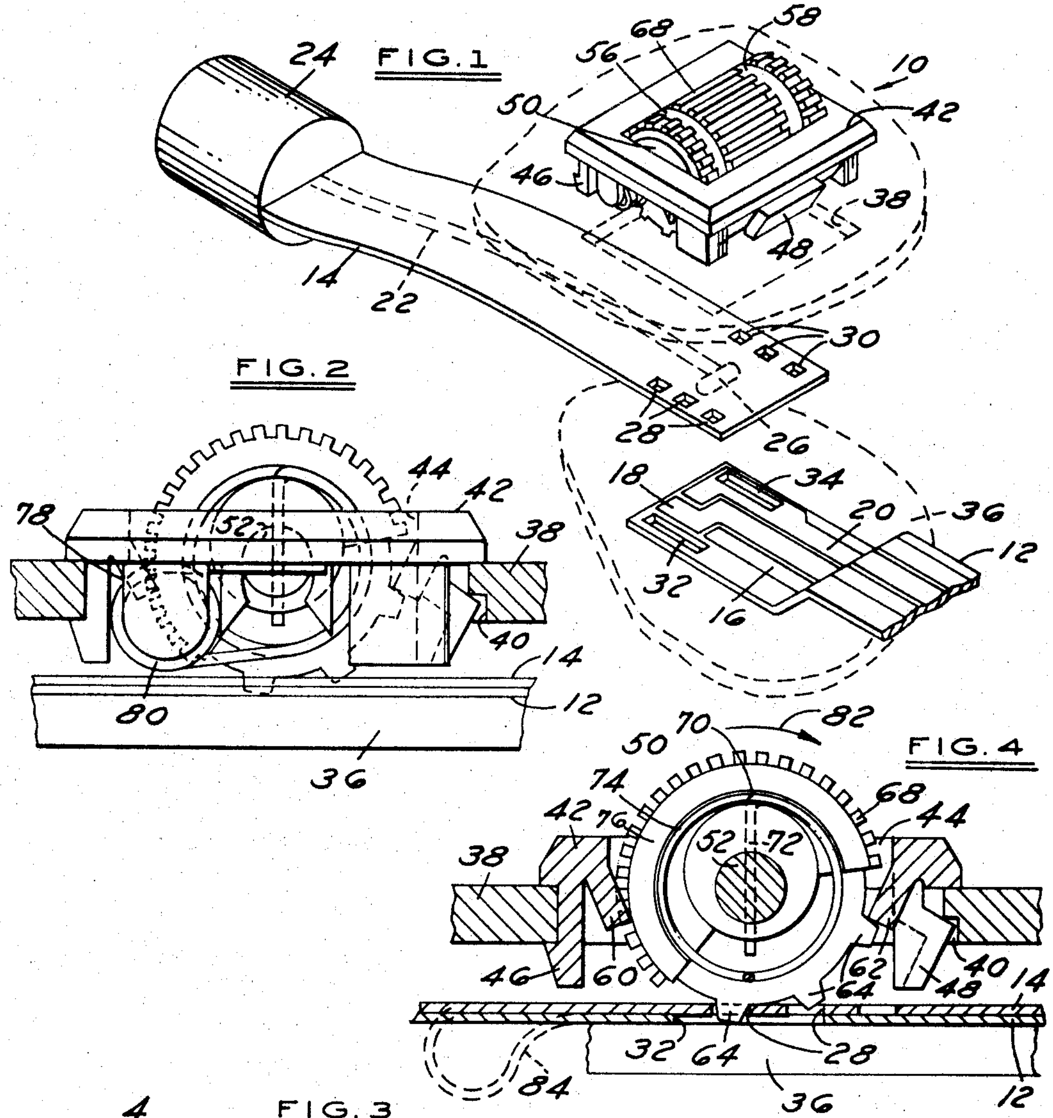
FIGURE 1 is an isometric view, with parts exploded, of the switching apparatus of this invention and schematically illustrating the environment of this apparatus.
FIGURE 2 is a side elevation view of the switching apparatus of FIGURE 1.
FIGURE 4 is a view similar to FIGURE 2 but showing parts in section and illustrating in phantom a second embodiment of this invention.
Figure 3:
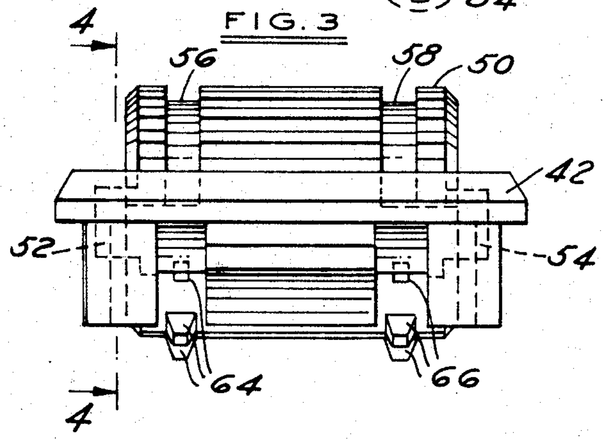
FIGURE 3 is an end elevation view of the switching apparatus of FIGURES 1 and 2.

Referring now in detail to the drawings, the numeral 10 denotes generally apparatus constructed in accordance with this invention for accomplishing electrical switching between a pair of flat printed circuit elements or harnesses 12 and 14. Harnesses 12 and 14 are constructed of flexible synthetic material such as "Mylar" that is nonconductive and well known in the art. Harness 12 has formed thereon, from conductive material such as flat cooper wires or strips, a plurality of electrically conductive paths 16, 18 and 20. Harness 14 has formed thereon an electrically conductive path 22 including an enlarged bridging portion 26 at one end thereof. The end of conductive path 22 remote from rigid portion 26 is electrically connected to some type of electrical apparatus such as a power consuming or distributing member 24.

It should be noted that harnesses 12 and 14 are oriented such that the surfaces of these harnesses carrying the conductive paths are proximate one another. It is to be understood that harnesses 12 and 14 may be constructed such that the entire surfaces of the conductive paths carried thereon are exposed, as illustrated, or that only the portion of these electrically conductive paths, wherein switching occurs, is exposed, the remainder of the electrically conductive paths being covered by the nonconductive synthetic material comprising the body of the harnesses. Also, it readily may be appreciated that the electrically conductive paths illustrated on harnesses 12 and 14 are for purposes of illustration only and that harnesses capable of being used in conjunction with this invention may have any desired configuration of electrically conductive paths.

Harness 14 has formed therethrough two rows of apertures 28 and 30. Each of these rows of apertures is located near an edge portion of harness 14. Harness 12 has formed therethrough a pair of clearance holes 32 and 34. These clearance holes are substantially greater in length than holes 28 and 30 formed through harness 14. Harnesses 12 and 14 are positioned such that holes 28 and 30 of harness 14 are arranged over holes 32 and 34 respectively of harness 12. The significance of this orientation will be explained in detail below.

Direct switching between the conductive paths of harnesses 12 and 14 is made possible by structure including a lower support member 36 and an upper support member 38, parallel to and spaced from support member 36. Harness 12 is secured to lower support member 36 by adhesive or other suitable bonding techniques. Harness 14 is positioned to overlie harness 12 with holes 28 and 30 registering with clearance holes 28 and 30 respectively.

Upper support member 38 has formed therethrough an aperture 40 adapted to receive a housing 42. Housing 42 has formed therethrough a central aperture 44 and has extending therefrom a pair of flexible fingers 46 and 48 adapted to be deformed to pass through aperture 44 of upper support member 48 and then engage the sidewalls of aperture 44. It thus may be seen that housing 44 is secured to upper support member 38 by means of a removable snap-action connection due to the engagement of the side walls of aperture 44 by deformable fingers 46 and 48.

A cylinder 50 is positioned in aperture 44 and has extending from the end walls thereof pins 52 and 54 that are journalled in the side walls of housing 42, thus permitting rotation of cylinder 50. About the periphery of cylinder 50 are formed a pair of circumferential grooves 56 and 58. Cylinder 50 is positioned within aperture 44 of housing 42 so that each of grooves 56 and 58 receive a pair of stops 60 and 62 extending from the side walls of aperture 44 of housing 42. (Only one pair of such stops are shown.) Three radially extending teeth 64 project from the bottom surface of groove 56 of cylinder 50. In a similar manner, three teeth 66 extend from the bottom surface of groove 58. The dimensions of these teeth are such that they are receivable within apertures 28 and 30 formed in harness 14. A portion of the outer arcuate surface of cylinder 50 remote from teeth 64 and 66 has formed thereon knurls 68 enabling simple manual rotation of cylinder 50.

As best illustrated in FIGURES 2 and 4, cylinder 50 is urged into a neutral position by the forces exerted by a spring 70. One end 72 of spring 70 is positioned in a groove formed in the end surface of cylinder pin 52. A second portion 74 of spring 70 is circular and surrounds pin 52 and is positioned in a groove cut in end wall 76 of cylinder 50. A projection 78 of housing 42 is surrounded by and secures a third portion 80 of spring 70. This spring configuration and positioning provides that cylinder 50 is biased by the force of spring 70 to a central or neutral position (not sown). The position of cylinder 50 illustrated in FIGURES 2 and 4 results in a rotation counterclockwise, as viewed, from the center or neutral position. When cylinder 50 is in the position illustrated in FIGURES 2 and 4, spring 70 is exerting a force tending to rotate cylinder 50 in the direction illustrated by the arrow 82 of FIGURE 4.

The construction and arrangement of the apparatus as described above permits the apparatus to function to accomplish electrical switching directly between the conductive paths of harnesses 12 and 14 as follows. Since groups of teeth 64 and 66 are received within rows of holes 28 and 30 respectively, rotation of cylinder 50 manually will cause a movement of movable harness 12 relative to stationary harness 14. No interference between the cylinder teeth and harness 12 occurs during rotation of cylinder 50 since the presence of holes 32 and 34 in harness 12 provides clearance for the cylinder teeth as the latter moves through circular arcs. The relative movement between harnesses 12 and 14 permits varying types of electrical contact between bridging member 26 of conductive path 22 of harness 14 and the conductive paths 16, 18 and 20 of harness 12. As described above, however, the conductive paths illustrated are for purposes of example only and any type of conductive path desired may be formed on harnesses 12 and 14, depending on the particular switching and circuitry of the electrical devices used in conjunction with this apparatus.

The device illustrated is a three position switch. One position is a neutral or center position of cylinder 50. If no external manual force is exerted on cylinder 50, the force of spring 70 urges cylinder 50 into this neutral position and the center tooth of each group of teeth 64 and 66 will extend vertically downward. The position of cylinder 50 illustrated in FIGURES 2 and 4 is a second switch position wherein cylinder 50 has been rotated counterclockwise. This counterclockwise rotation of cylinder 50 will be limited by the contact of one tooth of each group of teeth of 64 and 66 with stop 62. The third switch position occurs when cylinder 50 is rotated from the neutral or center position clockwise until the one tooth of each group of teeth 64 and 66 remote from stop 62 abuts stop 60.

A second embodiment of this invention is illustrated in phantom in FIGURE 4. In this second embodiment, harness 14 is a portion of harness 12. This arrangement is accomplished by folding back a portion of harness 12 against itself to form the loop 84. In all other respects, the second embodiment of invention is identical in construction and operation to the first embodiment of the invention described above. The second embodiment of invention permits direct switching between the conductive paths of a single harness without the need for a distinct switch assembly.

It may thus be seen that this invention provides for the direct switching between conductive paths of flexible circuit harnesses without the need for distinct and separate switch assemblies. Switching is provided by bringing into and out of intimate contact various portions of the conductive harness paths themselves.

It is to be understood that this invention is not limited to the exact construction illustrated and described above or the abstract preceding this specification, but that various changes and modifications may be made without departing from the spirit and scope of the invention as defined by the following claims.

1. Apparatus for accomplishing electrical switching between a pair of flat printed circuit portions including electrically conductive paths and comprising: a pair of spaced apart supporting members, one of said circuit portions positioned between said members and secured to one of said members, the other of said circuit portions positioned for movement between said one circuit portion and the other of said members and in intimate contact with said one circuit portion, a housing secured to a supporting member, actuating means carried by said housing and movable relative thereto, and cooperating engaging means on said actuating means and said other circuit portion causing movement of the latter along said one circuit portion upon movement of said actuating means and the making and breaking of electrical contact between conductive paths of said circuit portions.

2. The apparatus of claim 1, wherein said circuit portions comprises flexible, flat wire wiring harness.

3. Apparatus for accomplishing electrical switching between a pair of flat printed circuit portions including electrically conductive paths and comprising: a pair of spaced supporting members, one of said circuit portions positioned between said members and secured to one of said members, the other of said circuit portions positioned for movement between said one circuit portion and the other of said members in intimate contact with said one circuit portion, a housing secured to the other of said members, rotatable means journalled in said housing and movable relative thereto, and cooperating engaging means on said rotatable means and said other circuit portion causing movement of the latter along said one circuit portion upon rotation of said rotatable means and the making and breaking of electrical contact between conductive paths of said circuit portions.

4. The apparatus of claim 3, wherein said circuit portions comprise flexible, flat wire wiring harnesses.

5. The apparatus of claim 3, wherein said other supporting member comprises a panel having an opening extending therethrough, said housing extending through said opening and having a pair of resilient means projecting therefrom, said resilient means yieldably engaging said panel adjacent said opening to removably position and secure said housing relative to said panel.

6. The apparatus of claim 3, wherein said rotatable means comprises a cylinder, said engaging means including a plurality of teeth extending radially from said cylinder and a plurality of openings extending through said other circuit portion, each of said openings capable of receiving one of said teeth.

7. The apparatus of claim 6, including spring means exerting forces yieldably urging said cylinder into a first position, said cylinder manually rotatable against the forces of said spring means back and forth about said first position.

8. Apparatus for accomplishing electrical switching between a pair of elongate, flat circuit elements having electrically conductive paths extending therealong, said apparatus comprising: a pair of spaced supporting means defining a space therebetween, a portion of each of said circuit elements located in said space, one of said circuit elements secured to one of said supporting means and the other of said circuit elements being positioned in intimate contact with said first circuit element for movement relative thereto, manually rotatable motivating means operatively secured to the other of said supporting means and having at least one projection extending therefrom, said other circuit element having at least one aperture extending therethrough adapted to receive said projection whereby rotation of said motivating means causes movement of said other circuit element relative to said one circuit element and the making and breaking of electrical contact between said conductive of said circuit elements.

9. Apparatus according to claim 8, wherein said motivating means comprises a cylinder having two sets of spaced apart, radially extending teeth projecting therefrom, said other circuit element having two spaced apart rows of apertures formed therethrough, each of said rows of apertures adapted to receive the teeth of one of said sets of teeth.

10. Apparatus according to claim 8, including stop means operatively secured to said other supporting means and limiting the extent of rotation of said motivating means.

11. Apparatus for accomplishing electrical switching between conductive paths formed on an elongate, flexible wiring harness, said apparatus comprising: a pair of spaced apart supporting members, a first portion of said harness located between said members and secured to one of said supporting members, a second portion of said harness being folded back into intimate contact against said first harness portion to form a harness loop, rotatable means operatively connected to the other of said supporting members, and cooperating engaging means on said rotatable means and said second portion of said harness causing movement of the latter along said first harness portion upon rotation of said rotatable means and the making and breaking of electrical contact between conductive paths formed on said harness portions.

References Cited

UNITED STATES PATENTS

| | | | |
|---|---|---|---|
| 3,268,674 | 8/1966 | Golbeck et al. | |
| 3,278,714 | 10/1966 | Bernutz. | |
| 3,333,068 | 7/1967 | Maskens. | |
| 3,350,530 | 10/1967 | Fry. | |
| 3,393,392 | 7/1968 | Shelley | 174—68.5 |

ROBERT K. SCHAEFER, *Primary Examiner.*

R. A. VANDERHYE, *Assistant Examiner.*

U.S. Cl. X.R.

174—68.5